(12) United States Patent
Kumar

(10) Patent No.: US 8,035,451 B2
(45) Date of Patent: Oct. 11, 2011

(54) ON-THE-FLY FREQUENCY SWITCHING WHILE MAINTAINING PHASE AND FREQUENCY LOCK

(75) Inventor: Anand Kumar, Noida (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 48 days.

(21) Appl. No.: 12/636,663

(22) Filed: Dec. 11, 2009

(65) Prior Publication Data

US 2011/0140789 A1    Jun. 16, 2011

(51) Int. Cl.
*H03L 7/06* (2006.01)
*H03L 7/18* (2006.01)

(52) U.S. Cl. ............. 331/16; 331/1 A; 331/25; 327/156; 327/157; 327/159

(58) Field of Classification Search ............. 331/1 A, 331/16, 17, 18, 25; 327/156–159; 329/325; 332/127; 360/51; 375/376; 455/260
See application file for complete search history.

(56) References Cited

U.S. PATENT DOCUMENTS 6,137,368 A * 10/2000 Cho ................................ 331/16

* cited by examiner

*Primary Examiner* — David Mis
(74) *Attorney, Agent, or Firm* — Gardere Wynne Sewell LLP

(57) ABSTRACT

A difference between a reference clock and feedback clock is detected to generate a difference signal that is filtered to generate a voltage controlled oscillator control signal and produce an oscillation signal having an oscillation frequency. A first frequency dividing circuit divides the oscillation signal by a selected one of a number of first frequency divisors to generate an output signal at a selected frequency. A second frequency dividing circuit divides the output signal by a selected one of a number of second frequency divisors to generate the feedback clock. The frequency divisors are selected by a frequency selection signal. The first frequency dividing circuit samples the frequency selection signal at the rate of the oscillation signal divided by a least common multiple of the plurality of first frequency divisors. The second frequency dividing circuit samples the sampled frequency selection signal at the rate of the feedback clock.

42 Claims, 6 Drawing Sheets

ON-THE-FLY FREQUENCY SWITCHING WHILE MAINTAINING PHASE AND FREQUENCY LOCK

BACKGROUND OF THE INVENTION

1. Technical Field of the Invention

The present invention relates to switching the frequency of a clock signal.

2. Description of Related Art

It is a requirement in certain applications, such as with communications systems that support different data rates, for the frequency of a clock signal to be switched between different frequency values on an instantaneous (or nearly instantaneous) basis. This requirement arises from the need to ensure that communicated data is not lost while the communications system supports and switches between different data rates.

Clock generation circuitry of the Phase Lock Loop (PLL) type is commonly used to generate clock signals. These PLL-type clocks can be controlled (or programmed) to switch the clock signal frequency among and between two or more clock frequencies. However, there is generally a need for a lock time to be associated with each frequency change. Instantaneous frequency change of the clock signal is not possible due to the delay introduced by the lock time.

A need exists in the art for a PLL-type clock generation circuit having a controllable frequency that can be switched on-the-fly between at least two frequencies without requiring a lock time. Preferably, this PLL-type clock generation circuit will maintain frequency lock, phase lock and clock de-skew as the output clock makes frequency changes.

SUMMARY OF THE INVENTION

In an embodiment, a circuit comprises: a phase and frequency detector adapted to detect a difference between a reference clock and a feedback clock and generate a difference signal; a filter adapted to filter the difference signal and generate a voltage control signal; a voltage controlled oscillator responsive to the voltage control signal and adapted to generate an oscillation signal; a first frequency divider adapted to divide the oscillation signal by a selected one of a plurality of first frequency divisors to generate an output signal at a selected frequency; and a second frequency divider adapted to divide the output signal by a selected one of a plurality of second frequency divisors to generate the feedback clock.

In another embodiment, a circuit comprises: a voltage controlled oscillator adapted to generate an oscillation signal, and a first frequency divider adapted to divide the oscillation signal by a selected one of a plurality of frequency divisors to generate an output signal at a selected frequency. The first frequency divider comprises: a sampling circuit adapted to sample a frequency selection signal at a frequency rate of the oscillation signal divided by a least common multiple of the plurality of first frequency divisors; a plurality of divider circuits adapted to divide the oscillation signal by the plurality of first frequency divisors; and a selection circuit responsive to the sampled frequency selection signal to select an output of one of the plurality of divider circuits as the output signal.

In another embodiment, a circuit comprises: a detector adapted to detect a difference between a reference clock and a feedback clock and generate a difference signal for a phase-lock-loop circuit, and a frequency divider adapted to divide an output signal of the phase-lock-loop circuit by a selected one of a plurality of frequency divisors to generate the feedback clock. The frequency divider comprises: a sampling circuit adapted to sample a frequency selection signal for the phase-lock-loop circuit at a frequency rate of the feedback clock; a plurality of divider circuits adapted to divide the output signal by the plurality of frequency divisors; and a selection circuit responsive to the feedback clock sampled frequency selection signal to select an output of one of the plurality of divider circuits as the feedback clock.

Embodiments further comprise methods of operation in accordance with the circuits described above.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
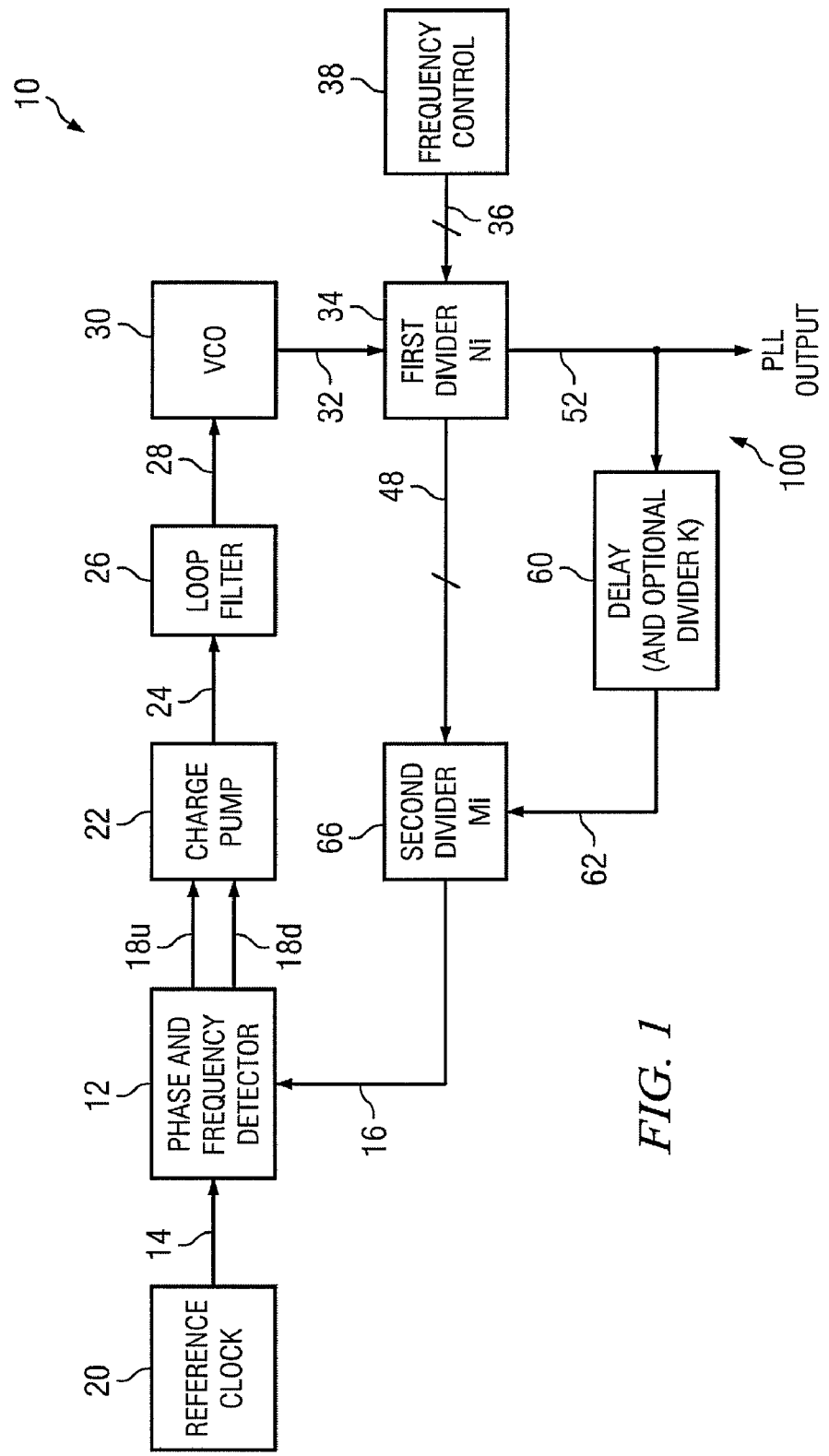
FIG. 1 a block diagram of an embodiment for a PLL-type clock generation circuit supporting on-the-fly clock frequency switching while maintaining phase and frequency lock.

Reference is now made to FIG. 1 which shows a block diagram of an embodiment for a PLL-type clock generation circuit 10 supporting on-the-fly clock frequency switching while maintaining phase and frequency lock. The circuit 10 is implemented, for example, as an analog-type PLL (although the circuit and method of operation may be extended as well to a digital circuitry implementation). The circuit 10 includes a phase and frequency detector circuit 12 which receives a first input signal 14 and a second input signal 16. The first input signal 14 is a reference input clock received from a reference clock generator 20. The second input signal 16 is a feedback clock signal. The detector circuit 12 compares the first and second input signals (14 and 16) and produces an error signal 18 which is proportional to a detected phase difference between the reference input clock 14 and feedback clock signal 16.

The error signal 18 is represented in the illustrated implementation (which uses a charge pump) by an UP signal 18u and a DOWN signal 18d, it being understood that this is by example only and that the error signal 18 can take on a number of forms known to those skilled in the art. In the context of the charge pump implementation, the PLL-type clock generation circuit 10 includes a charge pump circuit 22 which receives the UP signal 18u and DOWN signal 18d of the error signal 18. The charge pump circuit 22 generates an output voltage signal 24 whose voltage level is controlled by the UP signal 18u and DOWN signal 18d. An error signal 18 from the phase and frequency detector circuit 12 which emphasizes the UP signal 18u will cause the charge pump circuit 22 to increase the voltage level of the output voltage signal 24. Conversely, an error signal 18 from the phase and frequency detector circuit 12 which emphasizes the DOWN signal 18d will cause the charge pump circuit 22 to decrease the voltage level of the output voltage signal 24.

The output voltage signal 24 (which is representative of the phase and frequency difference between the reference input clock 14 and feedback clock signal 16) then passes through a loop filter 26 to generate a voltage control signal 28. The loop filter 26 is typically of the low-pass filter type and its frequency response characteristics are designed in a manner well known to those skilled in the art to stabilize circuit operation.

It will be recognized by those skilled in the art that the charge pump circuit 22 and loop filter 26 can be replaced by equivalent circuitry which is responsive to the error signal 18 and generates a stabilized voltage control signal 28 having a voltage representative of the phase and frequency difference between the reference input clock 14 and feedback clock signal 16.

The PLL-type clock generation circuit 10 further includes a voltage controlled oscillator (VCO) 30 which generates a VCO output signal 32 also referred to herein as the "VCO clock". The frequency of the VCO output signal 32 is controlled in a manner proportional to the voltage of the voltage control signal 28 received from the loop filter 26. In conventional prior art PLL circuits, the VCO output signal 32 may comprise the PLL output signal which is then processed in a divider loop to generate the feedback clock 16. That is not the case, however, with respect to the PLL-type clock generation circuit 10 as shown in FIG. 1.

Figure 2:
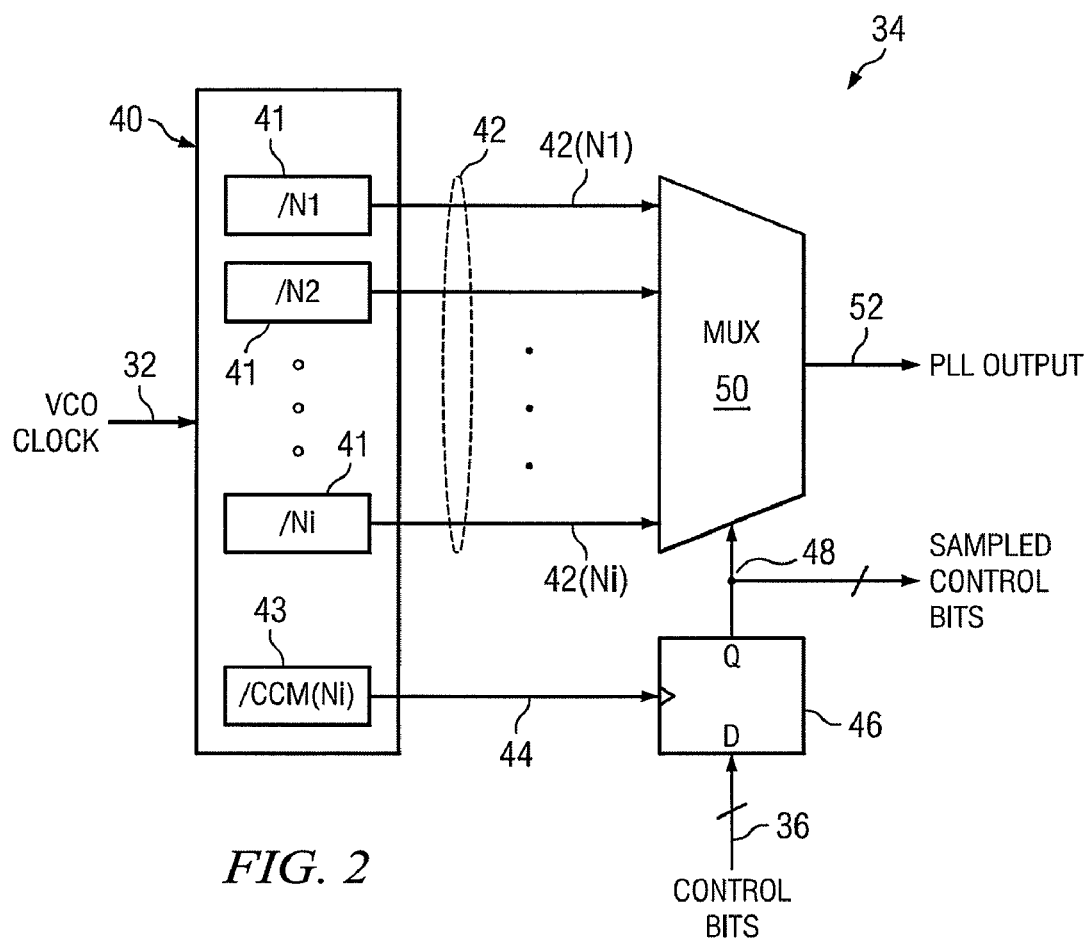
FIG. 2 is a block diagram of a first divider circuit used within the PLL-type clock generation circuit of FIG. 1.

The VCO output signal 32 (the VCO clock) is applied to a first input of a first divider circuit 34. A block diagram of the first divider circuit 34 used within the PLL-type clock generation circuit is shown in FIG. 2. A second input 36 of the first divider circuit 34 receives one or more control bits provided by a frequency control circuit 38 for the purpose of making a frequency selection with respect to a PLL output clock. The first divider circuit 34 includes a plural divider circuit 40 which receives the VCO output signal 32 (the VCO clock) and through plural divide by Ni circuits 41 generates a plurality of frequency divided output signals 42 of the form VCO clock/Ni. The divide by Ni circuits 41 of the plural divider circuit 40 provide for a synchronous division of the VCO clock so as to generate the plurality of frequency divided output signals 42 in parallel. Thus, a first divide by Ni circuit 41 produces a first one of the frequency divided output signals 42(N1) comprising a signal at a frequency equal to the frequency of the VCO clock/N1, while a last divide by Ni circuit 41 produces a last one of the frequency divided output signals 42(Ni) comprising a signal at a frequency equal to the frequency of the VCO clock/Ni, where the divisor Ni is an integer preferably a power of 2 (i.e., Ni=1, 2, 4, 8, ... ). The plural divider circuit 40 includes an additional frequency divider circuit 43 generating a sampling signal 44 at a frequency equal to the frequency of the VCO clock/(LCM(Ni)), wherein "LCM" stands for the least common multiple of Ni (for example, the LCM of Ni, where Ni=1, 2, 4, and 8, would be 8). This LCM(Ni) value further sets the frequency relationship between the reference clock 14 and the VCO clock 32 as implemented by the VCO 30 in response to the control signal 28 (and thus in the example above the frequency of the VCO is eight times (LCM(Ni)=8) the frequency of the reference clock 14). The plurality of frequency divided output signals 42(N1)-42(Ni) and the sampling signal 44 are generated on the VCO output signal 32 (the VCO clock) such that positive edges of all clocks output from the plural divider circuit 40 are aligned.

Although the divisor Ni is preferably selected from the integers which are powers of 2, it will be understood that Ni could alternatively comprise any suitable integer value.

The first divider circuit 34 further includes a data sampling circuit 46. The sampling circuit 46 receives the sampling signal 44 and the control bits of the second input 36. The sampling circuit 46 responds to edge transitions of the sampling signal 44 to pass the control bits of the second input 36 to the sampling output 48. The sampling circuit 46 is illustrated, by example only, in the form of a D-type flip flop circuit, it being recognized that one flip flop is provided for each control bit of the second input 36. Thus, where Ni=1, 2, 4, and 8, there are four different frequency divisions being performed and thus two D-type flip flop circuits would be included in the sampling circuit 46 with two control bits (D0 and D1) in the second input 36 and two sampled control bits (D0_sampled and D1_sampled) in the sampling output 48.

The sampling output 48 is provided to the control input of a multi-input multiplexer circuit 50. The multiple inputs of the multiplexer circuit 50 are connected to receive the plurality of divided output signals 42 from the plural divider circuit 40. Responsive to the sampled control bits in the sampling output 48, the multiplexer circuit 50 passes a selected one of the plurality of frequency divided output signals 42 to the output of the multiplexer circuit 50 as the PLL output signal 52. The use of sampled control bits in the sampling output 48 ensures glitch-free frequency transition at the output 52 of the multiplexer circuit 50. Thus, where Ni=1, 2, 4, and 8, there would be four frequency divided output signals 42 to select between using the two sampled control bits (D0_sampled and D1_sampled) in the sampling output 48 (obtained by sampling the two control bits (D0 and D1) in the second input 36 at the VCO output/LCM(Ni) frequency rate).

The following Table details the state of operation of the first divider 34 with respect to the exemplary implementation described above:

| D1 | D0 | Ni |
|---|---|---|
| 0 | 0 | 1 |
| 0 | 1 | 2 |
| 1 | 0 | 4 |
| 1 | 1 | 8 |

Responsive to D1=0 and D0=0, the sampling output 48 will cause the multiplexer 50 to select the frequency divided output signal 42 (signal VCO clock/1) generated by the one of the divide by Ni circuits 41 in the first divider 34 using a divisor of one (Ni=1). In this instance, the VCO clock 32 and PLL output 52 each have a frequency that is eight times the reference clock 14 (where Ni=1). Responsive to D1=0 and D0=1, the sampling output 48 will cause the multiplexer 50 to select the frequency divided output signal 42 (signal VCO clock/2) generated by the one of the divide by Ni circuits 41 in the first divider 34 using a divisor of two (Ni=2). In this instance, the VCO clock 32 has a frequency that is eight times the reference clock 14 and the PLL output 52 has a frequency that is four times the reference clock 14 (where Ni=2). Responsive to D1=1 and D0=0, the sampling output 48 will cause the multiplexer 50 to select the frequency divided output signal 42 (signal VCO clock/4) generated by the one of the divide by Ni circuits 41 in the first divider 34 using a divisor of four (Ni=4). In this instance, the VCO clock 32 has a frequency that is eight times the reference clock 14 and the PLL output 52 has a frequency that is two times the reference clock 14 (where Ni=4). Responsive to D1=1 and D0=1, the sampling output 48 will cause the multiplexer 50 to select the frequency divided output signal 42 (signal VCO clock/8) generated by the one of the divide by Ni circuits 41 in the first divider 34 using a divisor of eight (Ni=8). In this instance, the VCO clock 32 has a frequency that is eight times the reference clock 14 and the PLL output 52 has a frequency that is one times the reference clock 14 (where Ni=8).

Figure 3:
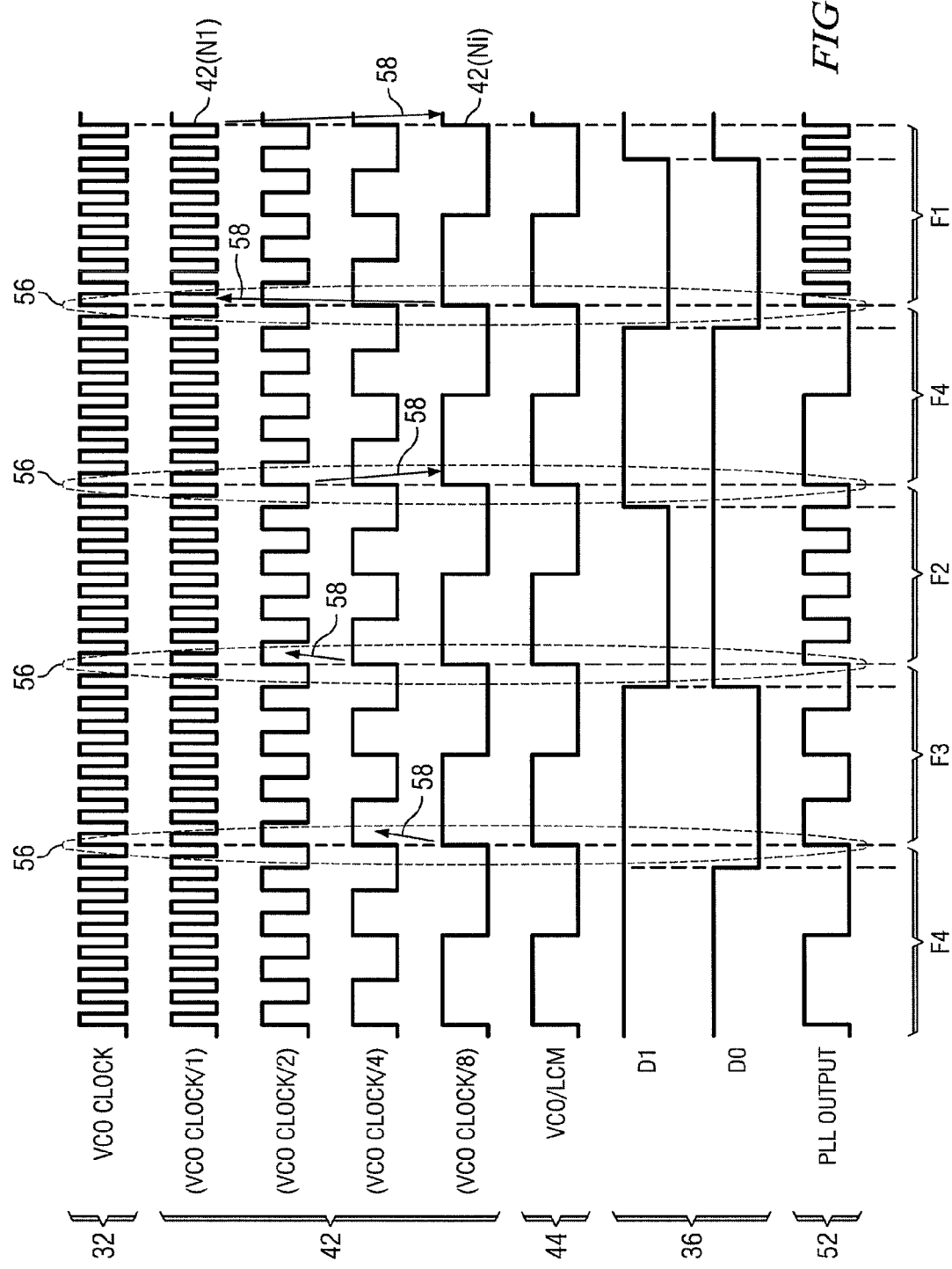
FIG. 3 illustrates the operational waveforms for the first divider circuit of FIG. 2.

Reference is now made to FIG. 3 which illustrates the operational waveforms for the first divider circuit 34. These waveforms are for an exemplary implementation where Ni=1, 2, 4, and 8. In this configuration, the frequency control circuit 38 can select among and between four different frequencies (F1-F4) for the PLL output signal 52 based on the values of the two control bits (D0 and D1) in the second input 36. The transition between selection of the plurality of frequency divided output signals 42 (for output from the multiplexer circuit 50 as the PLL output signal 52) that is caused by changes in the bits of the sampling output 48 is shown by arrows 58. The references 56 indicate edge alignment with respect to all of the clock signals in the first divider circuit 34, and it will further be noted that this alignment is maintained even though the change in the values of the two control bits (D0 and D1) in the second input 36 are not aligned with the clock or the instances of switching of frequency. The circuit operates, as a result of the sampling operation driven by the sampling signal 44 to ensure that changes in the frequency F1-F4 of the PLL output signal 52 occur while maintaining phase and frequency lock. In this example, F1=8*reference clock, F2=4*reference clock, F3=2*reference clock, and F4=1*reference clock.

Reference is once again made to FIG. 1. The PLL-type clock generation circuit 10 further includes a delay circuit 60 which receives the PLL output signal 52 and outputs a delayed PLL output signal 62. The delay circuit 60 can, for example, be implemented using a clock tree circuit as known in the art which applies a controlled time delay $t_d$ against the PLL output signal 52. Thus, the time delay $t_d$ provided by delay circuit 60 is tunable. The delay could be zero in some instances, or alternatively could be a non-zero value (with a maximum of one over the frequency of the feedback clock). The purpose of a non-zero value for the delay is to achieve clock de-skewing. Usually, the delay is generated by one of the branches in the clock tree. By doing so, the output of all other branches of the clock tree will also be aligned to the feedback clock and hence the reference clock so as to achieve clock de-skewing.

Figure 4:
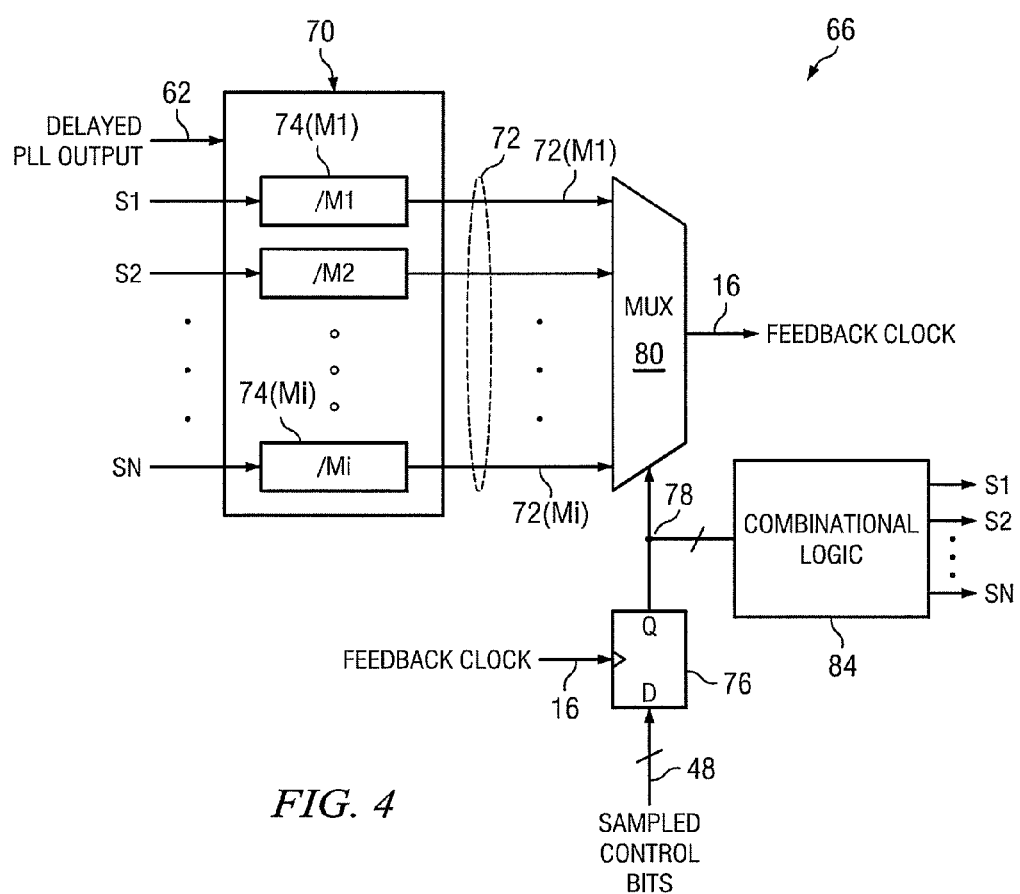
FIG. 4 is a block diagram of a second divider circuit used within the PLL-type clock generation circuit of FIG. 1.

The delayed PLL output signal 62 is applied to a first input of a second divider circuit 66. A block diagram of the second divider circuit 66 used within the PLL-type clock generation circuit is shown in FIG. 4. A second input of the second divider circuit 66 receives the sampled control bits in the sampling output 48 provided by the first divider circuit 34. The second divider circuit 66 includes a plural divider circuit 70 which receives the delayed PLL output signal 62 and a plurality of set signals (S1-SN). The plural divider circuit 70 includes a plurality of divide by Mi circuits 74 which output a corresponding plurality of frequency divided output signals 72 having frequencies equal to the frequency of the delayed PLL clock/Mi (wherein the number of divide by Mi circuits 74 is preferably equal to the number of divide by Ni circuits 41 used in the first divider circuit 34). The divide by Mi circuits 74 within the plural divider circuit 70 provide for synchronous division in generating the plurality of frequency divided output signals 72 in parallel. Thus, a first of the divide by Mi circuits 74(M1) produces a first frequency divided output signal 72(M1) (having a frequency equal to the frequency of the delayed PLL clock/M1), while a last of the divide by Mi circuits 74(Mi) produces a frequency divided output signal 72(Mi) (having a frequency equal to the frequency of the delayed PLL clock/Mi), where the divisor Mi is an integer preferably a power of 2 (i.e., Mi= . . . , 8, 4, 2, 1). It will be noted that the Mi ordering of the divide circuits 74 is intentionally the reverse of the Ni ordering of the divide circuits 41 used in the first divider circuit 34. The reason for this will be explained below.

Although the divisor Mi is preferably selected from the integers which are powers of 2, it will be understood that Mi could alternatively comprise any suitable integer value.

The second divider circuit 66 further includes a data sampling circuit 76. The sampling circuit 76 receives the feedback clock signal 16 at the sampling clock input and the sampled control bits in the sampling output 48 provided by the first divider circuit 34. The sampling circuit 76 responds to edge transitions of the sampling feedback clock signal 16 to pass the sampled control bits (48) to the sampling output 78 as feedback sampled bits. The sampling circuit 76 is illustrated, by example only, in the form of a D-type flip flop circuit, it being recognized that one flip flop is provided for each sampled control bit in the sampling output 48. Thus, where Mi=8, 4, 2, and 1, four states are possible for selection and thus two D-type flip flop circuits would be included in the sampling circuit 76 with two sampled control bits (D0_sampled and D1_sampled) 48 and two feedback sampled control bits (D0_feedback sampled and D1_feedback_sampled) in the sampling output 78.

The sampling output 78 is provided to the control input of a multi-input multiplexer circuit 80. The multiple inputs of the multiplexer circuit 80 are connected to receive the plurality of divided output signals 72 from the plural divider circuit 70. Responsive to the feedback sampled control bits in the sampling output 78, the multiplexer circuit 80 passes a selected one of the plurality of divided output signals 72 to the output of the multiplexer circuit 80 as the feedback clock signal 16. The use of feedback sampled control bits in the sampling output 78 ensures glitch-free frequency transition at the feedback clock signal 16 output of the multiplexer circuit 80. Thus, where Mi=8, 4, 2, and 1, there would be four divided output signals to select between using two control bits in the feedback sampling output (D0_feedback_sampled and D1_feedback_sampled) 78.

The set signals (S1-SN), which are individually applied to the corresponding divide by Mi circuits 74, function to selectively set the output of the associated divide by Mi circuit 74 to a certain state (for example, logic high) when the output of that circuit 74 has not been selected by the multiplexer circuit 80. Thus, if the frequency divided output signal 72 (M1) from a first of the divide by Mi circuits 74(M1) has been selected by the multiplexer circuit 80, then its corresponding set signal M1 will have a value enabling output while is set signals S2-SN applied to the remaining divide by Mi circuits 74 have a value which causes the circuit 74 output signals 72 to have a known state (for example, logic high).

The bits of the feedback sampling output 78 are logically combined by a combinational logic circuit 84 to generate the set signals (S1-SN). The combinational logic 84 decodes the bits of the sampling output 78 to generate the set signals S1-SN for setting the output signals 72 of all divide by Mi circuits 74, except for the signal 72 output by the multiplexer 80 selected divide by Mi circuits 74, to the known state. Design of a combinational logic 84 circuit to implement this functionality, for example, through the use of decoding NAND logic, is well known by those skilled in the art. The feedback clock 16 sampling of the sampled control bits in the sampling output 48 provided by the first divider circuit 34, combined with the setting of non-selected divide by Mi circuits 74 to a known state, ensures glitch-free selection between the plurality of divided output signals 72 at the multiplexer circuit 80.

The following Table, which repeats the details concerning the state of operation of the first divider 34, further details the state of operation of the second divider 66 with respect to the exemplary implementation described above:

| D1 | D0 | Ni | Mi |
|----|----|----|----|
| 0  | 0  | 1  | 8  |
| 0  | 1  | 2  | 4  |
| 1  | 0  | 4  | 2  |
| 1  | 1  | 8  | 1  |

Responsive to D1=0 and D0=0 (where the first divider 34 is operating to select signal VCO clock/1 using a divisor of one (Ni=1)), the sampling output 78 causes the multiplexer 80 to select the frequency divided output signal 72 (signal delayed PLL/8) generated by the one of the divide by Mi circuits 74 using a divisor of eight (Mi=8). In this instance, the VCO clock 32 and PLL output 52 each have a frequency that is eight times the reference clock 14 (where Ni=1), and the delayed PLL 62 must then be divided by eight (Mi=8) in the second divider 66 so that the feedback clock 16 and reference clock 14 are at the same frequency. Responsive to D1=0 and D0=1 (where the first divider 34 is operating to select signal VCO clock/2 using a divisor of two (Ni=2)), the sampling output 78 causes the multiplexer 80 to select the frequency divided output signal 72 (signal delayed PLL/4) generated by the one of the divide by Mi circuits 74 using a divisor of four (Mi=4). In this instance, the VCO clock 32 has a frequency that is eight times the reference clock 14, the PLL output 52 has a frequency that is four times the reference clock 14 (where Ni=2), and the delayed PLL 62 must then be divided by four (Mi=4) in the second divider 66 so that the feedback clock 16 and reference clock 14 are at the same frequency. Responsive to D1=1 and D0=0 (where the first divider 34 is operating to select signal VCO clock/4 using a divisor of four (Ni=4)), the sampling output 78 causes the multiplexer 80 to select the frequency divided output signal 72 (signal delayed PLL/2) generated by the one of the divide by Mi circuits 74 using a divisor of two (Mi=2). In this instance, the VCO clock 32 has a frequency that is eight times the reference clock 14, the PLL output 52 has a frequency that is two times the reference clock 14 (where Ni=4), and the delayed PLL 62 must then be divided by two (Mi=2) in the second divider 66 so that the feedback clock 16 and reference clock 14 are at the same frequency. Responsive to D1=1 and D0=1 (where the first divider 34 is operating to select signal VCO clock/8 using a divisor of eight (Ni=8)), the sampling output 78 causes the multiplexer 80 to select the frequency divided output signal 72 (signal delayed PLL/1) generated by the one of the divide by Mi circuits 74 using a divisor of one (Mi=1). In this instance, the VCO clock 32 has a frequency that is eight times the reference clock 14, the PLL output 52 has a frequency that is one times the reference clock 14 (where Ni=8), and the delayed PLL 62 must then be divided by one (Mi=1) in the second divider 66 so that the feedback clock 16 and reference clock 14 are at the same frequency.

It will accordingly be recognized that the first divider 34 functions to generate a clock which is the VCO clock divided by the least common multiple of Ni or Mi. This divided clock is the sampling clock of the first divider, and that sampling clock is used to sample the programming control bits for selecting the output clock frequency. The divider is implemented in such a way that a new division of the VCO clock starts in a glitch-free way immediately after sampling of the programming control bits.

Figure 5:
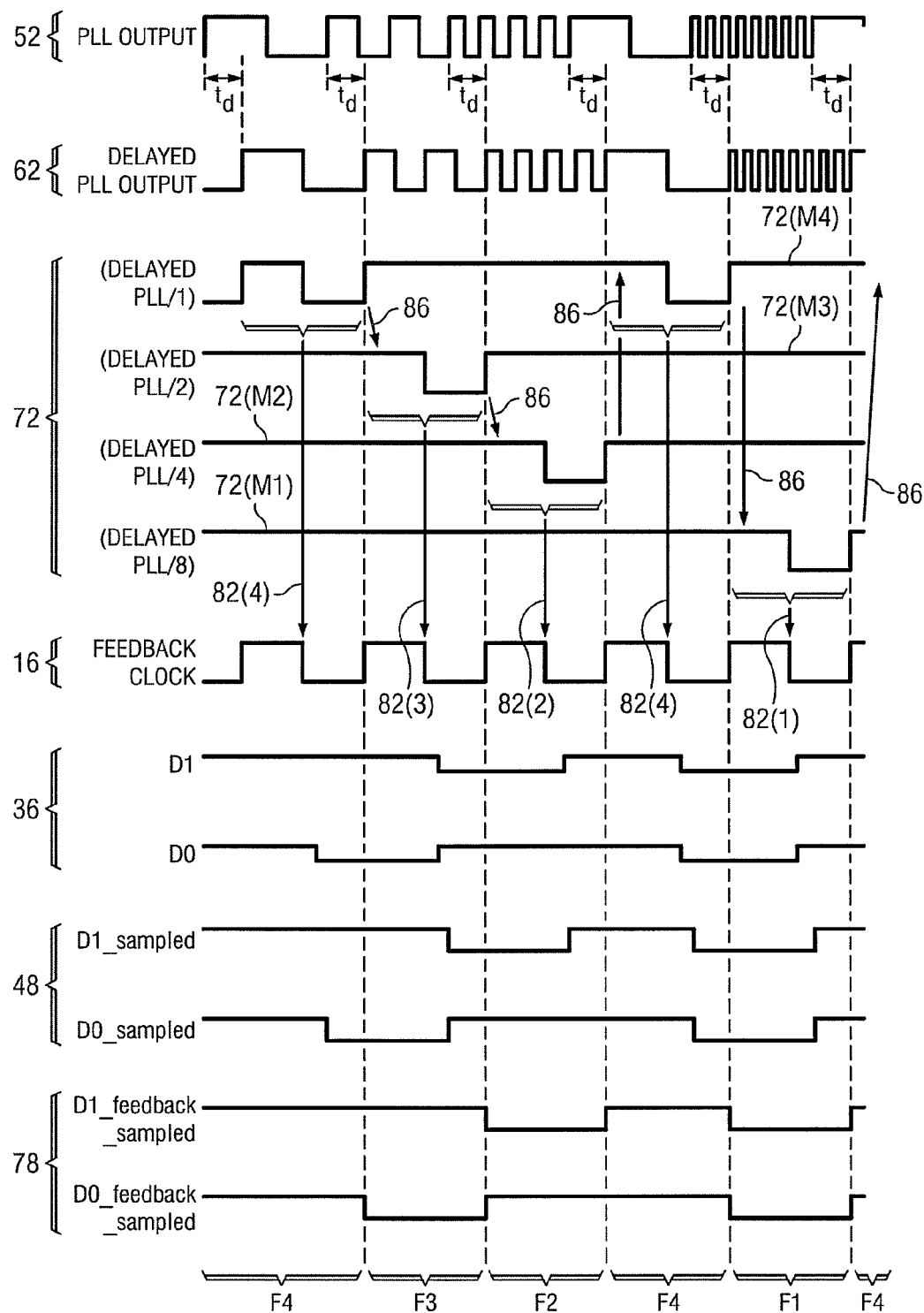
FIG. 5 illustrates the operational waveforms for the second divider circuit of FIG. 1.

Reference is now made to FIG. 5 which illustrates the operational waveforms for the second divider circuit 66. These waveforms are for an exemplary implementation where Mi=8, 4, 2, and 1. It will be recalled that the frequency control circuit 38 selects among and between four different frequencies (F1-F4) for the PLL output signal 52 based on the values of the two control bits (D0 and D1) in the second input 36 and two sampled control bits in the sampling output 48. The sampling circuit 76 in the second divider circuit 66 samples the bits of the sampling output 48 at the feedback clock 16 rate to generate the bits of the feedback sampling output 78. These feedback sampling output 78 bits are used in the second divider circuit 66 to select among and between the plurality of divided output signals 72 at the multiplexer circuit 80 to produce the feedback clock signal 16.

FIG. 5 shows the delayed PLL output signal 62 received by the second divider circuit 66. The delayed PLL output signal 62 is illustrated in timing relationship to the PLL output signal 52 so as to show the time delay $t_d$ introduced by the delay circuit 60. Again, the delay could have a zero or non-zero value so as to address clock de-skewing.

The divide by Mi circuits 74 within the plural divider circuit 70 provide for synchronous division in generating the plurality of divided output signals 72 in parallel. However, the bits of the feedback sampling output 78 control the multiplexer circuit 80 to select only one of the signals 72 for output as the feedback clock 16. This is illustrated at reference 82. The transition between the signals caused by changes in the bits of the sampling output 78 is shown by arrows 86. The bits of the feedback sampling output 78 are further applied to the combinational logic 84 circuit which generates the set signals S1-SN for selectively setting the output logic state of the N divide by Mi circuits 74 within the plural divider circuit 70. The signals 72 change state only when they are selected 82, at all other times being set to the known state (logic high) by the set signals S1-SN.

Thus, in the example shown in FIG. 5, the selection 82(1) of the divide by 8 signal 72(M1) is caused by both bits of the sampling output 78 being at logic low, and the combinational logic 84 circuit decodes these bits of the sampling output 78 to enable the divide by 8 circuit 74 through set signal S1, and to control setting of the output of the other circuits 74 using set signals S2-S4 to the known value. The selection 82(2) of the divide by 4 signal 72(M2) is caused by a first bit of the sampling output 78 being at logic low while a second bit is logic high, and the combinational logic 84 circuit decodes these bits of the sampling output 78 to enable the divide by 4 circuit 74 through set signal S2, and to control setting of the output of the other circuits 74 using set signals 51 and S3-S4 to the known value. The selection 82(3) of the divide by 2 signal 72(M3) is caused by a second bit of the sampling output 78 being at logic low while a first bit is logic high, and the combinational logic 84 circuit decodes these bits of the sampling output 78 to enable the divide by 2 circuit 74 through set signal S3, and to control setting of the output of the other circuits 74 using set signals S1-S2 and S4 to the known value. Lastly, the selection 82(4) of the divide by 1 signal 72(M4) is caused by both bits of the sampling output 78 being at logic high, and the combinational logic 84 circuit decodes these bits of the sampling output 78 to enable the divide by 1 circuit 74 through set signal S4, and to control setting of the output of the other circuits 74 using set signals S1-S3 to the known value. It will be noted that the operation of the second divider circuit 66 thus effectively produces the feedback clock 16 at the base operating frequency (same as the reference clock 14) of the PLL circuit 10 regardless of which frequency F1-F4 has been selected for the PLL output 52.

Within the second divider 66, the use of the set signals S1-SN is important to ensure glitch free switching (as the input frequency to the second divider 66 is of variable frequency while the feedback clock output of the second divider 66 must have a fixed frequency).

With reference once again to FIG. 1, the delay circuit 60 may further optionally include a divider circuit. For example, the optionally included divider circuit may divide the PLL output 52 by K (where K is an integer). In such a case, the sampling frequency for the control bits in the first divider 34 would be K*LCM(Ni). With respect to the exemplary implementation described herein: Ni=1, 2, 4, 8; K=2; and Mi=8, 4, 2, 1. The sampling clock 44 in this case would equal 16*frequency of the reference clock.

Figure 6:
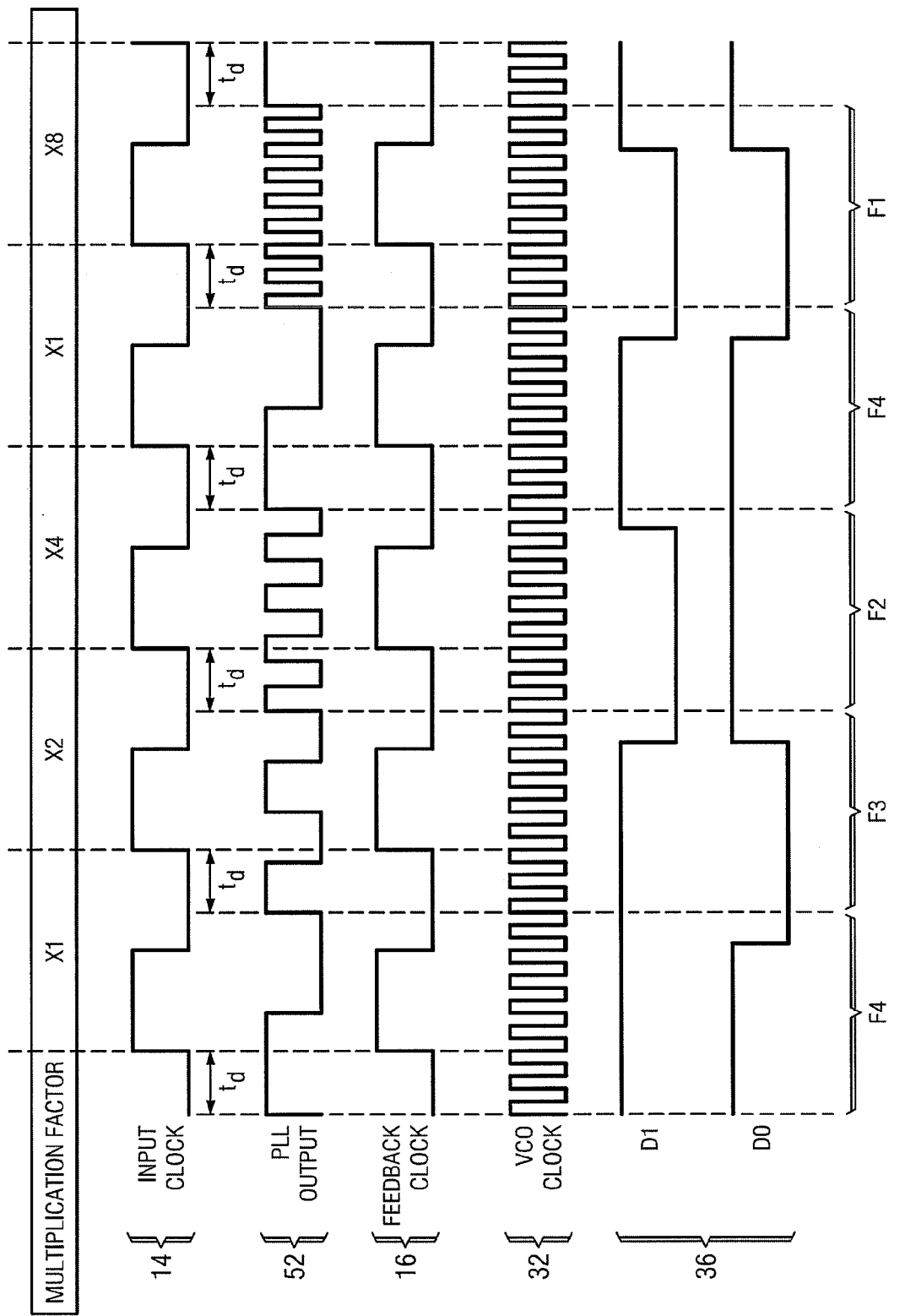
FIG. 6 illustrates the operational waveforms for the PLL-type clock generation circuit of FIG. 1.

Reference is now made to FIG. 6 which illustrates the operational waveforms for the PLL-type clock generation circuit 10 of FIG. 1. FIG. 6 illustrates that the time delay $t_d$ introduced by the delay circuit 60 is important so as to achieve clock de-skewing. FIG. 6 further illustrates that the PLL-type clock generation circuit 10 responds to two control bits (D0 and D1) in the second input 36 by changing the multiplication factor applied to the input clock 14 in producing the PLL output signal 52. It will further be noted that the PLL output signal 52 maintains phase and frequency lock during the frequency change operations. Lastly, it will be noted that the feedback clock 16 is at the same frequency as the reference clock 14 regardless of which frequency F1-F4 has been selected for the PLL output 52.

Thus, the loop divider 100 of the PLL-type clock generation circuit 10 of FIG. 1 is in essence formed of a set of two linked state machines. A first of those state machines is provided by the first divider 34 and a second of those state machines is provided by the second divider 66. The dividers 34 and 66 are linked through the common control provided by the control bits in the second input 36 (as applied to the divider 34) and the sampled input 48 (as applied to the divider 66). The dividers 34 and 66 are further linked through the delay element 60. The first state machine provided by divider 34 in the loop divider 100 generates the PLL output 52 from the VCO clock 32 at a divided frequency Ni set by the control bits in the second input 36. That divided frequency of the PLL output 52 is then processed in the second state machine provided by divider 66 at a divided frequency Mi also set by the control bits in the second input 36 (through sampled input 48). In this configuration, the VCO clock 32 has a frequency equal to Mi*Ni*frequency of the reference clock 14 (for the currently selected Mi and Ni divisor values), or has a frequency equal to LCM(Mi)*frequency of the reference clock 14.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
   a phase and frequency detector adapted to detect a difference between a reference clock and a feedback clock and generate a difference signal;
   a filter adapted to filter the difference signal and generate a voltage control signal;
   a voltage controlled oscillator responsive to the voltage control signal and adapted to generate an oscillation signal;
   a first frequency divider adapted to divide the oscillation signal by a selected one of a plurality of first frequency divisors to generate an output signal at a selected frequency;
   a second frequency divider adapted to divide the output signal by a selected one of a plurality of second frequency divisors to generate the feedback clock; and
   a time delay circuit coupled between the first frequency divider and second frequency divider and adapted to introduce a time delay in the output signal before application to the second frequency divider.

2. The circuit of claim 1 wherein the reference clock has a reference frequency and the selected one of a plurality of second frequency divisors divides the output signal so that the feedback clock is at the reference frequency regardless of the selected frequency of the output signal.

3. The circuit of claim 1 wherein the time delay provides for clock de-skewing.

4. A circuit comprising:
   a phase and frequency detector adapted to detect a difference between a reference clock and a feedback clock and generate a difference signal;
   a filter adapted to filter the difference signal and generate a voltage control signal;
   a voltage controlled oscillator responsive to the voltage control signal and adapted to generate an oscillation signal;
   a first frequency divider adapted to divide the oscillation signal by a selected one of a plurality of first frequency divisors to generate an output signal at a selected frequency;
   a second frequency divider adapted to divide the output signal by a selected one of a plurality of second frequency divisors to generate the feedback clock; and
   a third frequency divider coupled between the first frequency divider and second frequency divider and adapted to frequency divide the output signal before application to the second frequency divider.

5. The circuit of claim 1 wherein the first frequency divider is adapted to receive a first frequency selection signal having a value indicative of the selected one of a plurality of first frequency divisors.

6. The circuit of claim 5 wherein the second frequency divider is adapted to receive a second frequency selection signal having a value indicative of the selected one of a plurality of second frequency divisors.

7. The circuit of claim 6 wherein the second frequency selection signal is derived from the first frequency selection signal.

8. A circuit comprising:
   a phase and frequency detector adapted to detect a difference between a reference clock and a feedback clock and generate a difference signal;
   a filter adapted to filter the difference signal and generate a voltage control signal;
   a voltage controlled oscillator responsive to the voltage control signal and adapted to generate an oscillation signal;
   a first frequency divider adapted to divide the oscillation signal by a selected one of a plurality of first frequency divisors to generate an output signal at a selected frequency; and a second frequency divider adapted to divide the output signal by a selected one of a plurality of second frequency divisors to generate the feedback clock;

wherein the first frequency divider is adapted to receive a first frequency selection signal having a value indicative of the selected one of a plurality of first frequency divisors; and wherein the first frequency divider includes a sampling circuit adapted to sample the first frequency selection signal at a frequency rate of the oscillation signal divided by a least common multiple of the plurality of first frequency divisors.

9. The circuit of claim 8 wherein the second frequency divider is adapted to receive a second frequency selection signal having a value indicative of the selected one of a plurality of second frequency divisors, and the second frequency selection signal is the sampled first frequency selection signal.

10. The circuit of claim 9 wherein the second frequency divider includes a sampling circuit adapted to sample the second frequency selection signal at a frequency rate of the feedback clock.

11. The circuit of claim 10 wherein the second frequency divider further includes a plurality of divider circuits adapted to divide the output signal by the plurality of second frequency divisors and a selection circuit responsive to the sampled second frequency selection signal to select an output of one of the plurality of divider circuits as the feedback clock.

12. The circuit of claim 11 wherein the second frequency divider further includes a combinational logic circuit adapted to decode the sampled second frequency selection signal and generate a plurality of control signals for selectively setting the outputs of certain ones of the plurality of second frequency divisors, other than a selected output chosen by the sampled second frequency selection signal, to a certain state so as to ensure generation of a glitch-free feedback clock from the output signal at the selected frequency.

13. The circuit of claim 8 wherein the first frequency divider further includes a plurality of divider circuits adapted to divide the oscillation signal by the plurality of first frequency divisors and a selection circuit responsive to the sampled first frequency selection signal to select an output of one of the plurality of divider circuits as the output signal.

14. A method, comprising:
detecting a difference between a reference clock and a feedback clock to generate a difference signal;
filtering the difference signal to generate a control signal;
generate an oscillation signal having an oscillation frequency set by the control signal;
first frequency dividing the oscillation signal by a selected one of a plurality of first frequency divisors to generate an output signal at a selected frequency;
second frequency dividing the output signal by a selected one of a plurality of second frequency divisors to generate the feedback clock; and
introducing a time delay in the output signal before performance of second frequency dividing.

15. The method of claim 14 wherein the reference clock has a reference frequency and second frequency dividing comprises dividing the output signal by the selected one of a plurality of second frequency divisors so that the feedback clock is at the reference frequency regardless of the selected frequency of the output signal.

16. The method of claim 14 wherein the time delay provides for clock de-skewing.

17. A method, comprising:
detecting a difference between a reference clock and a feedback clock to generate a difference signal;
filtering the difference signal to generate a control signal;
generate an oscillation signal having an oscillation frequency set by the control signal;
first frequency dividing the oscillation signal by a selected one of a plurality of first frequency divisors to generate an output signal at a selected frequency;
second frequency dividing the output signal by a selected one of a plurality of second frequency divisors to generate the feedback clock; and
frequency dividing the output signal before performance of second frequency dividing.

18. The method of claim 14 further comprising receiving a first frequency selection signal having a value indicative of the selected one of a plurality of first frequency divisors.

19. The method of claim 18 further comprising receiving a second frequency selection signal having a value indicative of the selected one of a plurality of second frequency divisors.

20. The method of claim 19 further comprising deriving the second frequency selection signal from the first frequency selection signal.

21. A method, comprising:
detecting a difference between a reference clock and a feedback clock to generate a difference signal;
filtering the difference signal to generate a control signal;
generate an oscillation signal having an oscillation frequency set by the control signal;
first frequency dividing the oscillation signal by a selected one of a plurality of first frequency divisors to generate an output signal at a selected frequency; and
second frequency dividing the output signal by a selected one of a plurality of second frequency divisors to generate the feedback clock;
further comprising receiving a first frequency selection signal having a value indicative of the selected one of a plurality of first frequency divisors;
wherein first frequency dividing comprises sampling the first frequency selection signal at a frequency rate of the oscillation signal divided by a least common multiple of the plurality of first frequency divisors.

22. The method of claim 21 further comprising receiving a second frequency selection signal having a value indicative of the selected one of a plurality of second frequency divisors, and wherein the second frequency selection signal is the sampled first frequency selection signal.

23. The method of claim 22 wherein second frequency dividing comprises sampling the second frequency selection signal at a frequency rate of the feedback clock.

24. The circuit of claim 23 wherein second frequency dividing comprises dividing the output signal by each of the plurality of second frequency divisors and selecting one divided output responsive to the sampled second frequency selection signal as the feedback clock.

25. The method of claim 24 wherein second frequency dividing further comprises selectively setting certain ones of the divided outputs, other than the divided output chosen by sampled second frequency selection signal, to a certain state so as to ensure generation of a glitch-free feedback clock from the output signal the selected frequency.

26. The circuit of claim 21 wherein first frequency dividing comprises dividing the oscillation signal by each of the plurality of first frequency divisors and selecting one divided output as the output signal.

27. A circuit, comprising:
a voltage controlled oscillator adapted to generate an oscillation signal;
a first frequency divider adapted to divide the oscillation signal by a selected one of a plurality of frequency divisors to generate an output signal at a selected frequency, the first frequency divider comprising:
a sampling circuit adapted to sample a frequency selection signal at a frequency rate of the oscillation signal divided by a least common multiple of the plurality of first frequency divisors;
a plurality of divider circuits adapted to divide the oscillation signal by the plurality of first frequency divisors; and
a selection circuit responsive to the sampled frequency selection signal and adapted to select an output of one of the plurality of divider circuits as the output signal.

28. The circuit of claim 27 wherein the voltage controlled oscillator and frequency divider are components of a phase-lock-loop circuit.

29. The circuit of claim 28 further comprising a feedback circuit adapted to generate a feedback clock of the phase-lock-loop circuit derived from the output signal.

30. The circuit of claim 29 wherein the feedback circuit comprises a second frequency divider adapted to divide the output signal by a selected one of a plurality of second frequency divisors to generate the feedback clock, the second frequency divider comprising:
a sampling circuit adapted to sample the sampled frequency selection signal at a frequency rate of the feedback clock;
a plurality of divider circuits adapted to divide the output signal by the plurality of second frequency divisors; and
a selection circuit responsive to the feedback clock sampled frequency selection signal and adapted to select an output of one of the plurality of divider circuits as the feedback clock.

31. The circuit of claim 30 further comprising a delay circuit adapted to at least one of delay or frequency divide the output signal before application to the plurality of divider circuits within the second frequency divider.

32. A method, comprising:
generating an oscillation signal;
first frequency dividing the oscillation signal by a selected one of a plurality of frequency divisors to generate an output signal at a selected frequency, wherein first frequency dividing comprising:
sampling a frequency selection signal at a frequency rate of the oscillation signal divided by a least common multiple of the plurality of first frequency divisors;
dividing the oscillation signal by each of the plurality of first frequency divisors; and
selecting one divided output as the output signal in response to the sampled frequency selection signal.

33. The method of claim 32 wherein generating and first frequency dividing are operational steps performed within a phase-lock-loop operation.

34. The method of claim 33 wherein the phase-lock-loop operation comprises generating a feedback clock derived from the output signal.

35. The method of claim 34 wherein generating the feedback clock comprises second frequency dividing the output signal by a selected one of a plurality of second frequency divisors to generate the feedback clock, wherein second frequency dividing comprises:
sampling the sampled frequency selection signal at a frequency rate of the feedback clock;
dividing the output signal by each of the plurality of second frequency divisors; and
selecting one divided output as the feedback clock in response to the feedback clock sampled frequency selection signal.

36. The method of claim 35 further comprising at least one of delaying or frequency dividing the output signal before dividing the output signal within the second frequency dividing operation.

37. A circuit, comprising:
a detector adapted to detect a difference between a reference clock and a feedback clock and generate a difference signal for a phase-lock-loop circuit;
a frequency divider adapted to divide an output signal of the phase-lock-loop circuit by a selected one of a plurality of frequency divisors to generate the feedback clock, the frequency divider comprising:
a sampling circuit adapted to sample a frequency selection signal for the phase-lock-loop circuit at a frequency rate of the feedback clock;
a plurality of divider circuits adapted to divide the output signal by the plurality of frequency divisors; and
a selection circuit responsive to the feedback clock sampled frequency selection signal and adapted to select an output of one of the plurality of divider circuits as the feedback clock.

38. The circuit of claim 37 further comprising a delay circuit adapted to delay the output signal by a time delay before application to the plurality of divider circuits within the frequency divider.

39. The circuit of claim 38 further comprising an additional frequency divider adapted to frequency divide the output signal by a time delay before application to the plurality of divider circuits within the frequency divider.

40. A method, comprising:
detecting a difference between a reference clock and a feedback clock and generate a difference signal for a phase-lock-loop circuit;
frequency dividing an output signal of the phase-lock-loop circuit by a selected one of a plurality of frequency divisors to generate the feedback clock, wherein frequency dividing comprising:
sampling a frequency selection signal for the phase-lock-loop circuit at a frequency rate of the feedback clock;
dividing the output signal by each of the plurality of frequency divisors; and
selecting one divided output as the feedback clock in response to the feedback clock sampled frequency selection signal.

41. The method of claim 40 further comprising delaying the output signal by a time delay before frequency dividing.

42. The method of claim 40 further comprising additionally frequency dividing the output signal before frequency dividing.

* * * * *